US012764939B2

(12) United States Patent
Scarbrough et al.

(10) Patent No.: US 12,764,939 B2
(45) Date of Patent: Oct. 13, 2026

(54) BIT LINES HAVING HIGH ELECTRICAL CONDUCTIVITY AND LOW MUTUAL CAPACITANCE AND RELATED APPARATUSES, COMPUTING SYSTEMS, AND METHODS

(71) Applicant: Micron Technology, Inc., Boise, ID (US)

(72) Inventors: Alyssa N. Scarbrough, Boise, ID (US); David Ross Economy, Boise, ID (US); John D. Hopkins, Meridian, ID (US); Jordan D. Greenlee, Boise, ID (US); Mithun Kumar Ramasahayam, Merdian, ID (US)

(73) Assignee: Micron Technology, Inc., Boise, ID (US)

( * ) Notice: Subject to any disclaimer, the term of this patent is extended or adjusted under 35 U.S.C. 154(b) by 856 days.

(21) Appl. No.: 18/046,088

(22) Filed: Oct. 12, 2022

(65) Prior Publication Data

US 2023/0209810 A1 Jun. 29, 2023

Related U.S. Application Data

(60) Provisional application No. 63/266,022, filed on Dec. 27, 2021.

(51) Int. Cl.

| | |
|---|---|
| ***H01L 27/108*** | (2006.01) |
| ***H01L 21/768*** | (2006.01) |
| ***H10B 12/00*** | (2023.01) |
| ***H10W 20/00*** | (2026.01) |
| ***H10W 20/46*** | (2026.01) |

(52) U.S. Cl.

CPC ....... *H10B 12/482* (2023.02); *H10B 12/0387* (2023.02); *H10W 20/072* (2026.01); *H10W 20/098* (2026.01); *H10W 20/46* (2026.01)

(58) Field of Classification Search

CPC .......... H01L 21/7682; H01L 21/76877; H10B 12/482; H10W 20/057; H10W 20/0595; H10W 20/072

See application file for complete search history.

(56) References Cited

U.S. PATENT DOCUMENTS

| | | | | |
|---|---|---|---|---|
| 2011/0068318 A1* | 3/2011 | Ishibashi | H10B 63/00 257/E21.602 |
| 2013/0214415 A1* | 8/2013 | Pachamuthu | H01L 21/76871 438/653 |

* cited by examiner

*Primary Examiner* — John A Bodnar

(74) *Attorney, Agent, or Firm* — TraskBritt

(57) ABSTRACT

Bit lines having high electrical conductivity and low mutual capacitance and related apparatuses, computing systems, and methods are disclosed. An apparatus includes an electrically insulating material and bit lines including copper in the electrically insulating material. The electrically insulating material defines air gaps between the bit lines. A method of manufacturing a memory device includes forming trenches in an electrically insulating material on or in circuitry of the memory device, forming a first electrically conductive material in the trenches, removing portions of the electrically insulating material to form air gaps between the trenches, recessing the first electrically conductive material, and replacing the first electrically conductive material that was removed with a second electrically conductive material. The second electrically conductive material is more electrically conductive than the first electrically conductive material. A memory device includes the apparatus. A computing system includes the memory device.

19 Claims, 10 Drawing Sheets

BIT LINES HAVING HIGH ELECTRICAL CONDUCTIVITY AND LOW MUTUAL CAPACITANCE AND RELATED APPARATUSES, COMPUTING SYSTEMS, AND METHODS

CROSS-REFERENCE TO RELATED APPLICATION

This application claims the benefit under 35 U.S.C. § 119(e) of U.S. Provisional Patent Application Ser. No. 63/266,022, filed Dec. 27, 2021, the disclosure of which is hereby incorporated herein in its entirety by this reference.

TECHNICAL FIELD

This disclosure relates generally to electrically conductive traces having high electrical conductivity and low mutual capacitance, and more specifically to bit lines formed using an electrically conductive material having a high electrical conductivity, and air gaps between the bit lines.

BACKGROUND

Continued demand for high-density devices has driven semiconductor device manufacturers to design device features at or near manufacturing process tolerances. For example, bit lines in memory devices may be manufactured at or near process tolerances, which may result in bit lines being relatively narrow and being relatively close to other bit lines. In other words, in order to keep chip area, or "real estate," occupied by the bit lines as small as possible, the bit lines may be made as narrow as possible and may be spaced as closely together as possible.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1A:
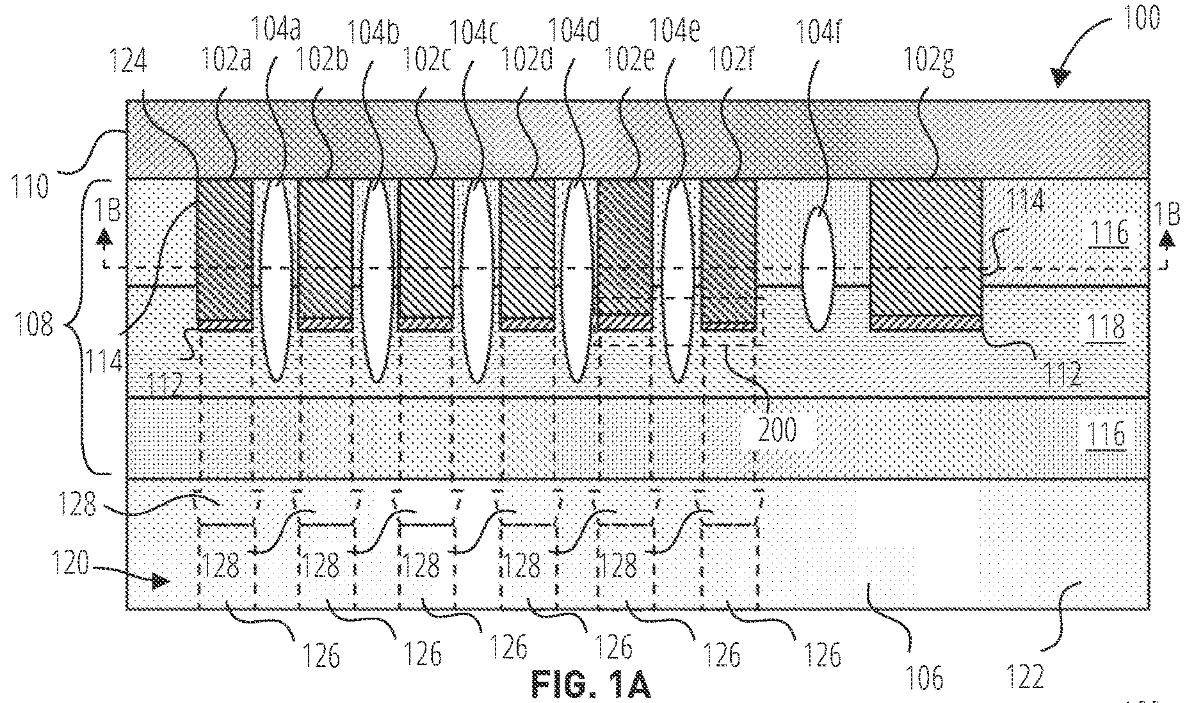
FIG. 1A is a cross-sectional view of an apparatus, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or of this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "semiconductor material" refers to a material having a conductivity between those of electrically insulating materials and electrically conductive materials. For example, a semiconductor material may have a conductivity of between about $10^{-8}$ Siemens per centimeter (S/cm) and $10^4$ S/cm ($10^6$ S/m) at room temperature (e.g., between about twenty degrees centigrade and about twenty-five degrees centigrade). Examples of semiconductor materials include elements found in column IV of the period table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the period table of elements (III-V semiconductor materials) or from columns II and VI of the period table of elements (II-VI semiconductor materials), without limitation. Semiconductor devices often include crystalline semiconductor materials. By way of non-limiting examples, transistors and diodes include crystalline semiconductor materials.

As used herein, the term "electrically conductive material" refers to materials having electrical conductivities greater than or equal to substantially $10^4$ S/cm. Various different electrically conductive materials may be used to electrically connect circuit elements in semiconductor devices. By way of non-limiting example, electrically conductive materials may be used for bit lines (e.g., data lines) of a memory device to electrically connect memory cells to circuitry of the memory device (e.g., sense amplifier circuitry). The unrelenting demand for ever smaller devices in semiconductor devices has driven width and spacing of bit lines in memory devices to manufacturing process tolerances. As a result, bit lines, as well as other electrically conductive features (e.g., electrically conductive traces) in various semiconductor devices, may be made as narrow as possible and may be spaced as closely together as possible.

Parasitic resistances of electrically conductive traces such as bit lines may increase as the width of such traces decreases (i.e., narrower traces generally have higher parasitic resistances than wider traces if all other things are substantially equal). As a result, parasitic resistances of electrically conductive traces have generally increased with the ever persistent demand for smaller devices and higher device density in semiconductor devices.

Also, parasitic capacitances between adjacent electrically conductive traces such as bit lines may increase as the distance between the adjacent traces decreases (i.e., traces that are closer together generally have higher mutual capacitance than traces that are further apart from each other if all other things are substantially equal). As a result, parasitic capacitances between electrically conductive traces have generally increased with the ever-persistent demand for smaller devices and higher device density in semiconductor devices.

The higher parasitic resistances and/or capacitances due to smaller and/or denser semiconductor devices may result in degradation of device performance as compared to larger and/or less dense semiconductor devices, which may have lower parasitic resistances and/or capacitances. For example, signal switching speed may be degraded due to higher resistances and/or capacitances. In devices such as memory devices, the higher parasitic resistances and/or capacitances of bit lines may increase a minimum detectable amount of charge that is delivered to a bit line during a read operation. With smaller and smaller charge storage elements (e.g., capacitive elements such as dynamic random access memory (DRAM) memory cells) used for memory cells, a relatively small amount of charge may be expected from a memory cell during a read operation. This relatively small amount of charge may be in opposition to increased minimum detectable amounts of charge at a bit line due, at least in part, to increased resistances and/or capacitances of bit lines. As a result, the likelihood of failed read operations may increase for smaller and/or denser bit lines.

One way to reduce the mutual capacitance between adjacent bit lines is to dispose a material having a low absolute permittivity between the bit lines. Since a mutual capacitance between electrically conductive plates, such as bit lines, is proportional to the absolute permittivity of the material between the plates (C=kA/d where C is the mutual capacitance, k is the absolute permittivity, A is the overlapping area of the electrically conductive plates, and d is the distance between the plates), the mutual capacitance may be relatively low if a material between bit lines has a relatively low absolute permittivity. Since air has an absolute permittivity substantially equal to that of free space, which has a minimum absolute permittivity, air gaps between bit lines may provide for a lowest practical mutual capacitance between the bit lines. As used herein, the term "air gap" refers to a gap of gas such as air, a vacuum gap, an air insulator, an opening, or other similar gap.

One way to reduce the parasitic resistance of a bit line is to use an electrically conductive material having a high electrical conductivity to form the bit line. Copper is an example of an electrically conductive material that has a relatively high electrical conductivity. Specifically, the electrical conductivity of copper at room temperature is substantially $59.5\times10^6$ Siemens/meter (S/m), which is much higher than electrical conductivities of other electrically conductive materials used in semiconductor devices. By comparison, the electrical conductivities of aluminum, tungsten, iron, and titanium are substantially $35\times10^6$ S/m, $17.9\times10^6$ S/m, $10\times10^6$, and $2.38\times10^6$ S/m, respectively.

Given the relatively low absolute permittivity of air gaps and the relatively high electrical conductivity of copper, relatively low parasitic capacitances and parasitic resistances may be achieved using copper bit lines with air gaps in between. Copper bit lines with air gaps therebetween, however, may not have sufficient mechanical strength to support bit line structures through stresses applied thereto during manufacturing processes. As a result, a more suitable electrically conductive material with superior mechanical strength (e.g., tungsten) may be used for bit lines to enable placement of air gaps between the bit lines. Tungsten, however, has a lower electrical conductivity than copper. This lower electrical conductivity of tungsten may result in a higher parasitic resistance of tungsten bit lines as compared to a lower parasitic resistance of copper bit lines, which may also result in degraded performance of the bit lines, as discussed above.

Disclosed herein are methods of manufacturing bit lines by forming (e.g., disposing) a first electrically conductive material having desirable mechanical strength characteristics, forming air gaps therebetween, recessing the first electrically conductive material, and replacing the recessed first electrically conductive material with a second electrically conductive material that is more electrically conductive than the first electrically conductive material. By way of non-limiting example, tungsten bit lines may be formed, air gaps may be formed therebetween, and at least a portion of the tungsten may be recessed and replaced with copper. Accordingly, apparatuses manufactured according to embodiments disclosed herein may benefit from the superior electrical conductivity of copper while simultaneously benefitting from the low absolute permittivity of air gaps therebetween. Bit lines manufactured according to embodiments disclosed herein may thus have relatively low parasitic resistances and capacitances, which may be beneficial given the ever-persistent demand for smaller and denser devices in semiconductor devices. These bit lines may be used in three-dimensional NAND devices (e.g., may be connected to strings of NAND memory cells, without limitation).

In some embodiments, an apparatus includes an electrically insulating material and bit lines including copper in the electrically insulating material. The electrically insulating material defines air gaps between the bit lines. The apparatus also includes strings of memory cells extending at least substantially perpendicularly to the bit lines and contacts electrically connecting the strings of memory cells to the bit lines.

In some embodiments a method of manufacturing a memory device includes forming trenches in an electrically insulating material over vertical strings of memory cells, forming a first electrically conductive material in the trenches, removing portions of the electrically insulating material to form air gaps between the trenches, removing at least a portion of the first electrically conductive material from the trenches, and forming a second electrically conductive material in the trenches to replace the removed first electrically conductive material. The second electrically conductive material is more electrically conductive than the first electrically conductive material.

In some embodiments a method of manufacturing a memory device includes forming a first electrically conductive material in trenches of an electrically insulating material over vertical strings of memory cells, removing excess portions of the first electrically conductive material to expose the electrically insulating material between the trenches, removing a portion of the electrically conductive material within the trenches, and forming a second electrically conductive material over the first electrically conductive material and within the trenches. The second electrically conductive material is more electrically conductive than the first electrically conductive material.

In some embodiments, an apparatus includes bit lines including copper, air gaps between the bit lines, word lines, and a memory cell array including memory cells corresponding to intersections between the bit lines and the word lines.

In some embodiments, a computing system includes a memory cell array and bit lines over the memory cell array. The memory cell array includes memory cells. The bit lines are connected to the memory cells. The bit lines include a first electrically conductive material and a second electrically conductive material. The second electrically conductive material is more electrically conductive than the first electrically conductive material.

FIG. 1A is a cross-sectional view of an apparatus 100, according to some embodiments.

Figure 1B:
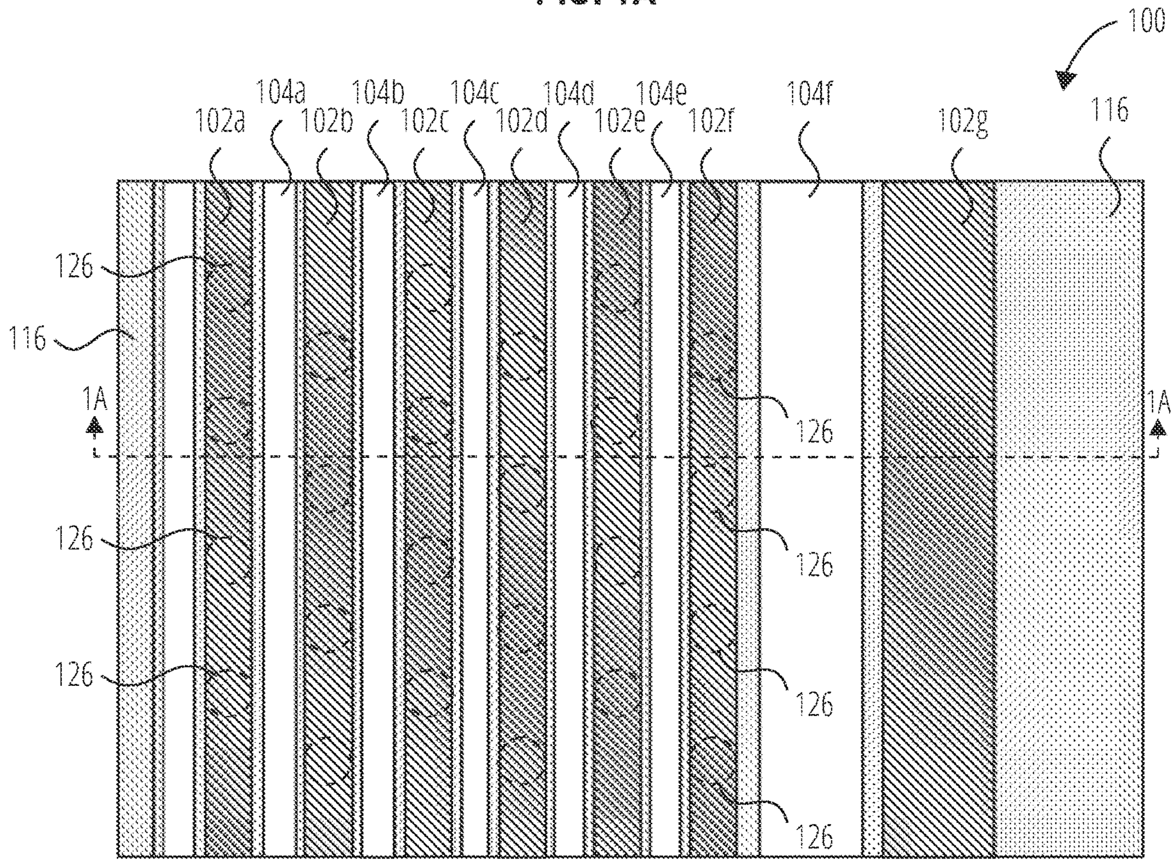
FIG. 1B is a cross-sectional view of the apparatus of FIG. 1A taken through line 1B of FIG. 1A.

FIG. 1B is a cross-sectional view of the apparatus 100 of FIG. 1A taken through line 1B of FIG. 1A. The cross-sectional view of FIG. 1A is taken through line 1A of FIG. 1B.

Referring to FIG. 1A and FIG. 1B together, the apparatus 100 includes circuitry 106, an electrically insulating material 108 adjacent to (e.g., on or in) the circuitry 106, and a cap material 110. The apparatus 100 may be a segment of a memory device. Accordingly, the circuitry 106 may include an array 120 of memory cells and periphery circuitry 122 (e.g., sense amplifiers, decoders, etc.). In some embodiments the memory device may be a three dimensional (3-D) NAND data storage device. In such embodiments the array 120 may include vertical strings 126 of memory cells (vertical strings 126 shown in broken lines to indicate presence of the vertical strings 126 behind or in front of the cross-sections illustrated in FIG. 1A and FIG. 1B). The apparatus 100 also includes bit lines 102*a*-102*g* in the electrically insulating material 108. The electrically insulating material 108 defines air gaps 104*a*-104*f* between the bit lines 102*a*-102*g*. In some embodiments the bit lines 102*a*-102*f* may be electrically connected to the vertical strings 126 via contacts 128 (contacts 128 shown in broken lines to indicate presence of the contacts 128 behind or in front of the cross-section illustrated in FIG. 1A).

In some embodiments, at least some of the bit lines 102*a*-102*g* include a first electrically conductive material 112 in a first portion and a second electrically conductive material 114 in a second portion. The second electrically conductive material 114 may be more electrically conductive than the first electrically conductive material 112. By way of non-limiting example, the first electrically conductive material 112 may include tungsten, which has an electrical conductivity of substantially $17.9\times10^6$ Siemens/meter (S/m) (at 20° centigrade), and the second electrically conductive material 114 may include copper, which has an electrical conductivity of substantially $59.5\times10^6$ S/m (at 20° centigrade). Accordingly, in some embodiments at least some of the bit lines 102*a*-102*g* include tungsten in a first portion and copper in a second portion. In some embodiments, the entirety of the bit lines 102*a*-102*g* may include substantially only the second electrically conductive material 114, substantially excluding the first electrically conductive material 112 (not shown). In some embodiments, the contacts 128 may include the first electrically conductive material 112 (e.g., tungsten).

In some embodiments, the apparatus 100 includes a liner material 124 between the electrically insulating material 108 and the bit lines 102*a*-102*g*. As a specific, non-limiting example, the liner material 124 may include tantalum.

Figure 2:
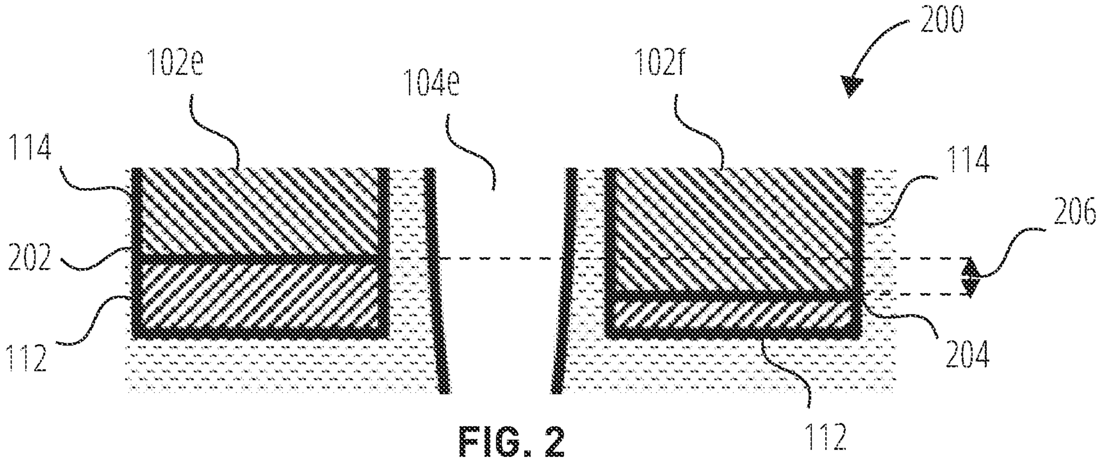
FIG. 2 is an enlarged cross-sectional view of a portion of the apparatus of FIG. 1A, according to some embodiments.

In some embodiments the electrically insulating material includes oxide materials 116 (e.g., silicon dioxide) staggered with (e.g., alternating with) nitride materials 118 (e.g., silicon nitride). FIG. 2 is an enlarged cross-sectional view of a portion 200 of the apparatus 100 of FIG. 1A, according to some embodiments. The portion 200 is shown enlarged to illustrate that in some embodiments, interfaces between the first electrically conductive material 112 and the second electrically conductive material 114 in the bit lines may be misaligned (e.g., not aligned, not horizontally aligned). Specifically, FIG. 2 illustrates an interface 202 between the first electrically conductive material 112 and the second electrically conductive material 114 of bit line 102*e* and an interface 204 between the first electrically conductive material 112 and the second electrically conductive material 114 of bit line 102*f*. FIG. 2 illustrates an offset 206 between interface 202 and interface 204. As a specific, non-limiting example, a first interface between first electrically conductive material 112 (e.g., tungsten) and the second electrically conductive material 114 (e.g., copper) in a first bit line may be misaligned with a second interface between the first electrically conductive material 112 and the second electrically conductive material 114 in a second, laterally adjacent bit line.

Figure 3:
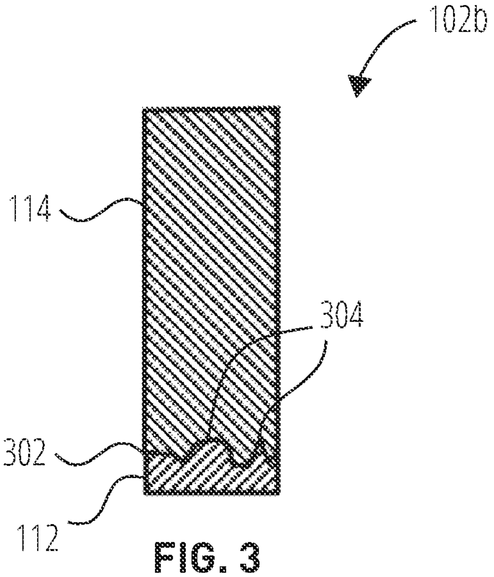
FIG. 3 is a cross-sectional view of a bit line of the apparatus of FIG. 1A and FIG. 1B, according to some embodiments.

FIG. 3 is a cross-sectional view of a bit line 102*b* of the apparatus 100 of FIG. 1A and FIG. 1B, according to some embodiments. As previously discussed, at least some of the bit lines 102*a*-102*g* of the apparatus 100 of FIG. 1A and FIG. 1B may include the first electrically conductive material 112 (e.g., tungsten) and the second electrically conductive material 114 (e.g., copper). Interfaces between the first electrically conductive material 112 and the second electrically conductive material 114 in FIG. 1A are illustrated using straight lines for the sake of simplicity. In some embodiments, however, an interface 302 between the first electrically conductive material 112 and the second electrically conductive material 114 may be rough (e.g., non-planar) (in contrast to smooth), as illustrated in FIG. 3. By way of non-limiting example, grains 304 of the first electrically conductive material 112 may protrude into the second electrically conductive material 114.

Figure 4A:
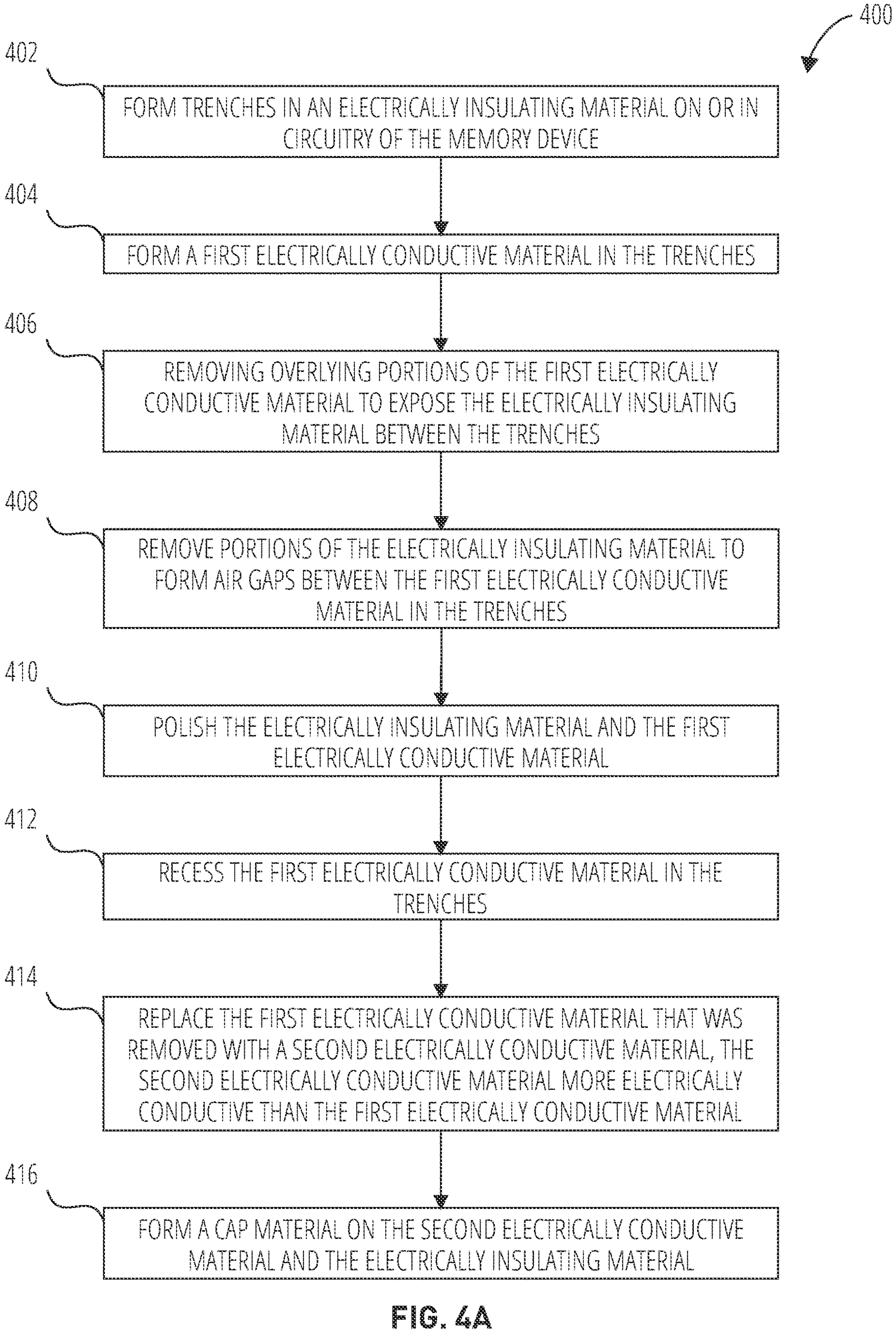
FIG. 4A is a flowchart illustrating a method of manufacturing a memory device, according to some embodiments.

FIG. 4A is a flowchart illustrating a method 400 of manufacturing a memory device, according to some embodiments.

FIG. 4B through FIG. 4J are cross-sectional views of a workpiece 418 illustrating the method 400 of FIG. 4A.

Figure 4B:
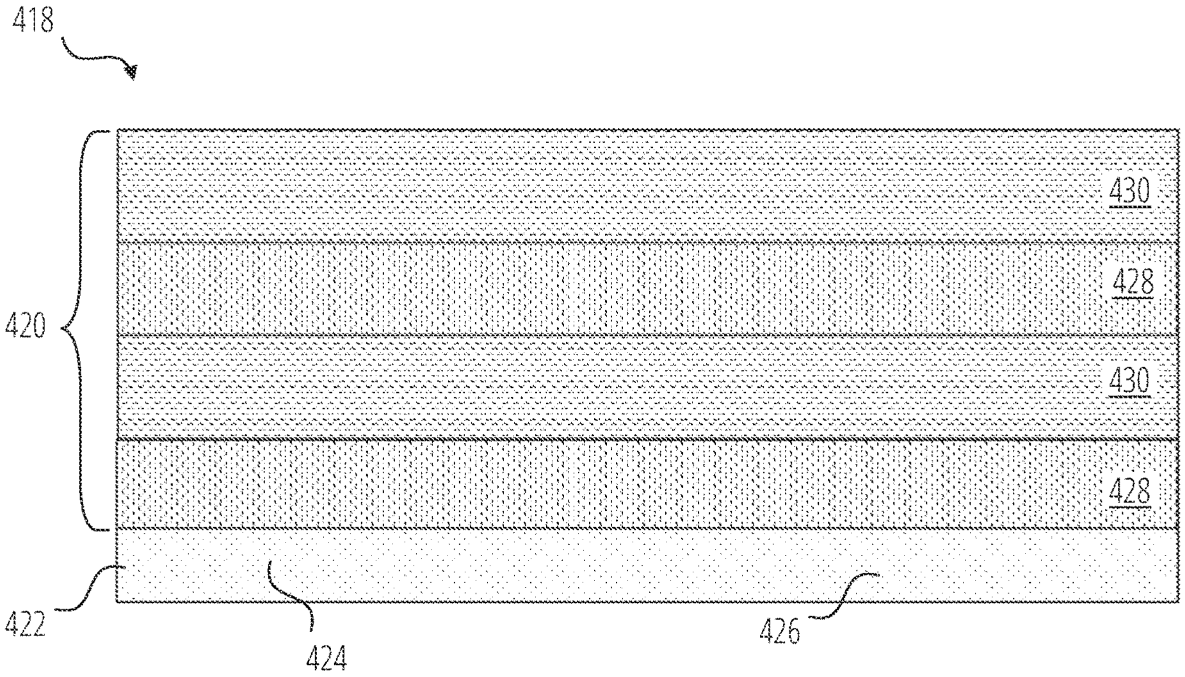
FIG. 4B through FIG. 4J are cross-sectional views of a workpiece illustrating the method of FIG. 4A.

Various embodiments according to the method 400 of FIG. 4A may be used to manufacture the apparatus 100 of FIG. 1A and FIG. 1B. Referring to FIG. 4A through FIG. 4J, the workpiece 418 illustrated in FIG. 4B includes circuitry 422 and electrically insulating material 420 similar to the circuitry 106 and the electrically insulating material 108 discussed above with reference to FIG. 1A and FIG. 1B. In some embodiments, the circuitry 422 may be circuitry of a memory device. In such embodiments the circuitry 422 may include an array 424 of memory cells and periphery circuitry 426 similar to the array 120 and the periphery circuitry 122 of FIG. 1A. Accordingly, the electrically insulating material 420 may be on or in the circuitry 422 of a memory device. In some embodiments the electrically insulating material 420 may include a stack of oxide materials 428 alternating with nitride materials 430, as illustrated in FIG. 4B.

Figure 4C:
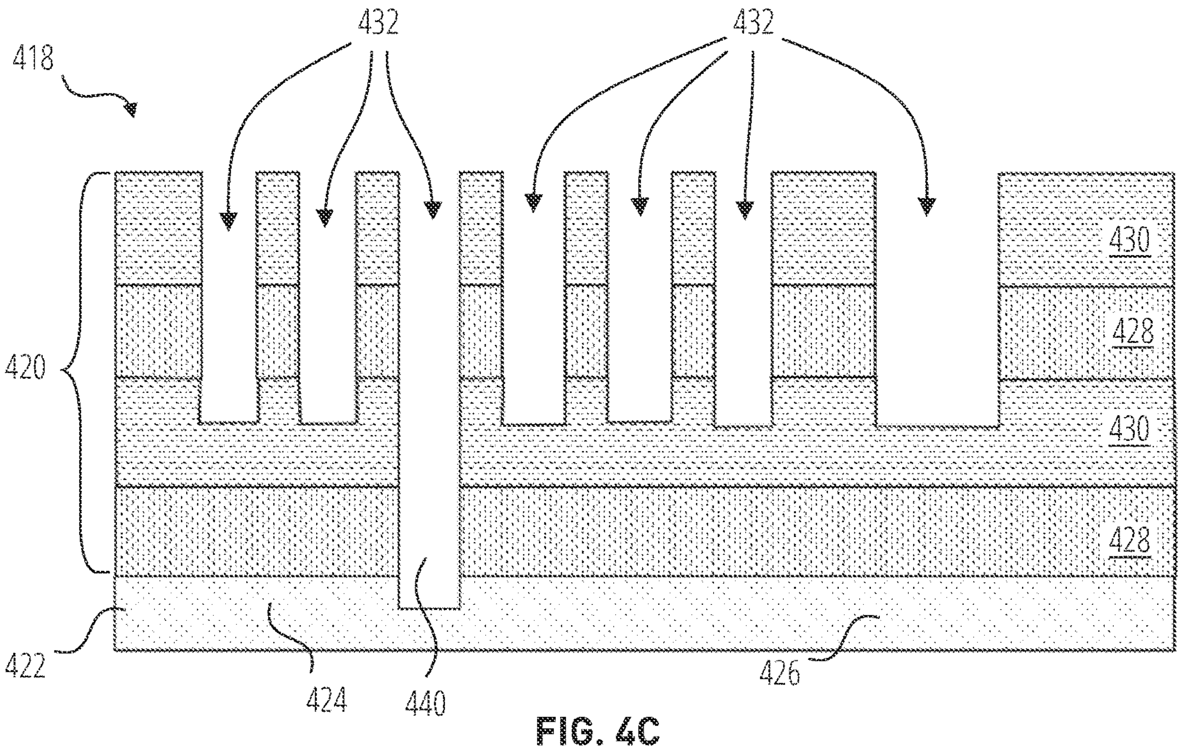

At operation 402, the method 400 includes forming trenches 432 in the electrically insulating material 420 on or in the circuitry 422 of the memory device. FIG. 4C illustrates the trenches 432 formed in the electrically insulating material 420. In some embodiments forming trenches 432 in the electrically insulating material 420 includes etching the trenches 432 into the electrically insulating material 420 using a dry etch process. However, other etch processes may be used. The trenches 432 may extend through an upper nitride material 430 and oxide material 428 and into a lower nitride material 430. A depth of each of the trenches 432 may be substantially the same. A lower surface of the trenches 432 may substantially correspond to a lower surface of the bit lines 102*a*-102*g* (FIG. 4J) ultimately to be formed in the trenches 432.

Since bit lines 102*a*-102*g* (FIG. 4J) to be formed in the trenches 432 will electrically connect to the circuitry 422 (e.g., to memory cells of the array 424 of memory cells), portions of the electrically insulating material 420 may be removed from below the trenches 432 at appropriate points (e.g., at the vertical strings 126 of FIG. 1A and FIG. 1B) along the trenches 432 to form a passageway 440 to the circuitry 422. This passageway 440 may enable an electrical contact (e.g., the contacts 128 of FIG. 1A) to be formed between one of the trenches 432 and the circuitry 422. One such point is illustrated in FIG. 4C. For example, the third from the left trench 432 is shown as extending to the circuitry 422. This trench 432, however, is of the same depth as the other trenches 432. FIG. 4C, however, illustrates this trench 432 contacting the circuitry 422. As a result, a passageway 440 extending from this trench 432 to the circuitry 422 is illustrated in FIG. 4C.

Figure 4D:
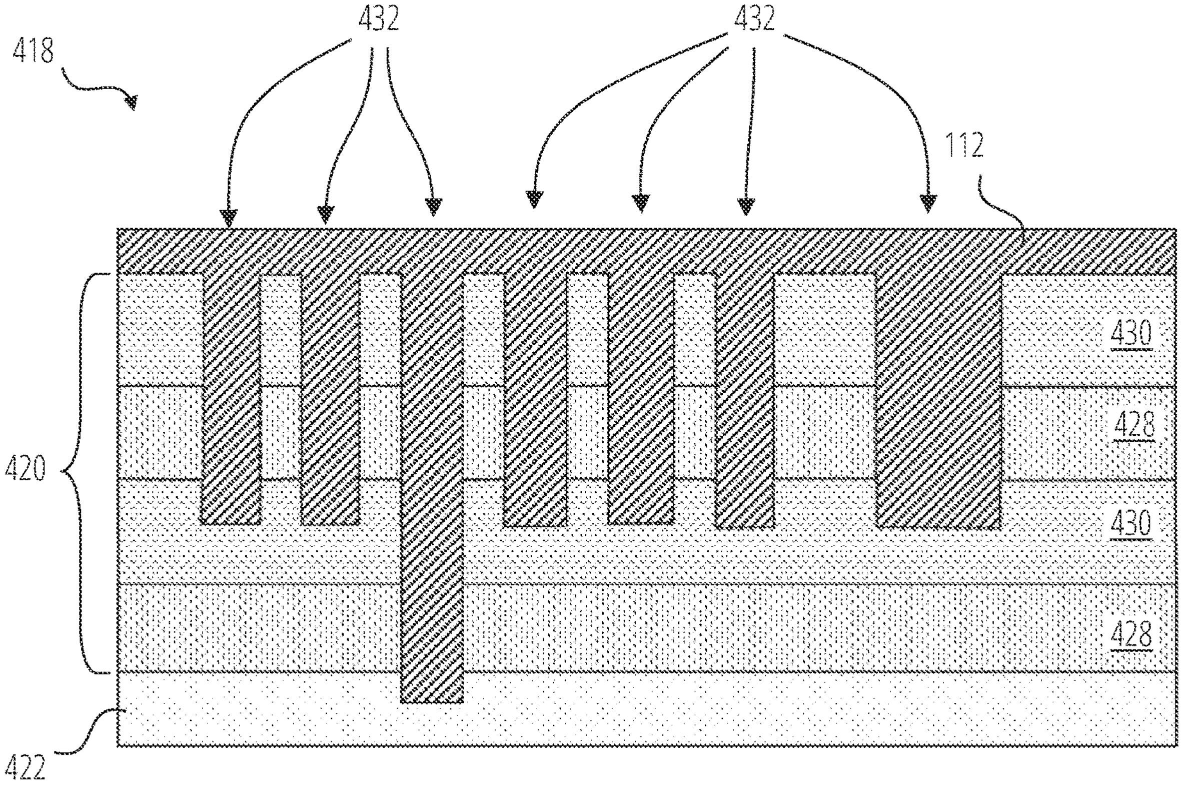

At operation 404, the method 400 includes forming a first electrically conductive material 112 in the trenches 432. FIG. 4D illustrates the first electrically conductive material 112 formed in the trenches 432 and over a top surface of the electrically insulating material 420. In some embodiments, forming the first electrically conductive material 112 in the trenches 432 includes forming tungsten in the trenches. In some embodiments, forming the first electrically conductive material 112 in the trenches 432 includes depositing the first electrically conductive material 112 (e.g., using a chemical vapor deposition (CVD) such as a tungsten hexafluoride gas CVD process). In some embodiments, forming the first electrically conductive material 112 includes spinning on the first electrically conductive material 112 using a spin coating process. The first electrically conductive material 112 may substantially fill the trenches 432 and form over the top surface of the electrically insulating material 420, as illustrated in FIG. 4D.

A liner material (not shown) may, optionally, be formed in the trenches 432 before forming the first electrically conductive material 112 in the trenches 432. In some embodiments, forming the first electrically conductive material 112 in the trenches 432 includes forming the liner material (e.g., a physical vapor deposition (PVD) tungsten material) and forming the first electrically conductive material 112 into the lined trenches 432.

Figure 4E:
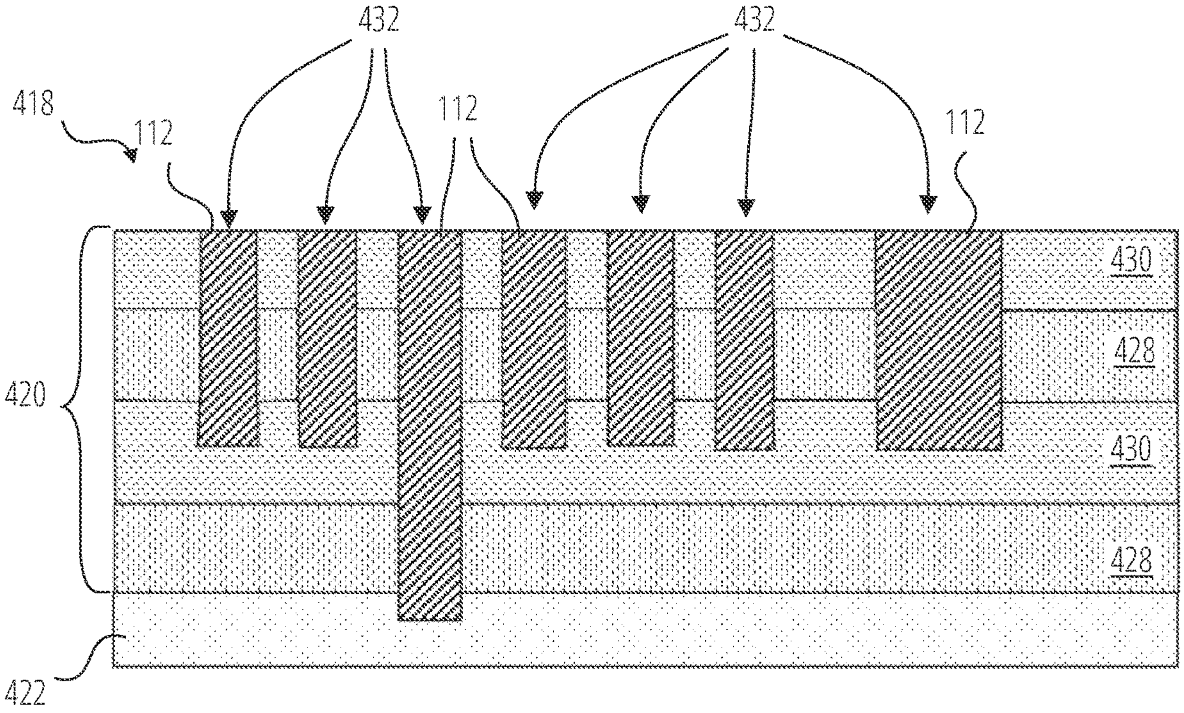

At operation 406 the method 400 includes removing overlying portions of the first electrically conductive material 112 to expose the underlying electrically insulating material 420 between the trenches 432 filled with the first electrically conductive material 112. FIG. 4E illustrates the overlying portions of the first electrically conductive material 112 removed to expose the electrically insulating material 420 between the trenches 432. A portion of the first electrically conductive material 112 and the upper nitride material 430 may be removed such that top surfaces of the first electrically conductive material 112 and the upper nitride material 430 are substantially coplanar. In some embodiments removing the first electrically conductive material 112 to expose the electrically insulating material 420 between the trenches 432 includes planarizing (e.g., using a polishing process such as a chemical-mechanical polishing (CMP) process) the first electrically conductive material 112. In some embodiments removing the first electrically conductive material 112 to expose the electrically insulating material 420 between the trenches 432 may also include removing a portion of the electrically insulating material 420, as illustrated in FIG. 4E (a portion of a top nitride material 430 in FIG. 4E has been recessed as compared to the corresponding nitride material 430 of FIG. 4D), which may occur as a result of a CMP process to remove the overlying portions of the first electrically conductive material 112.

Figure 4F:
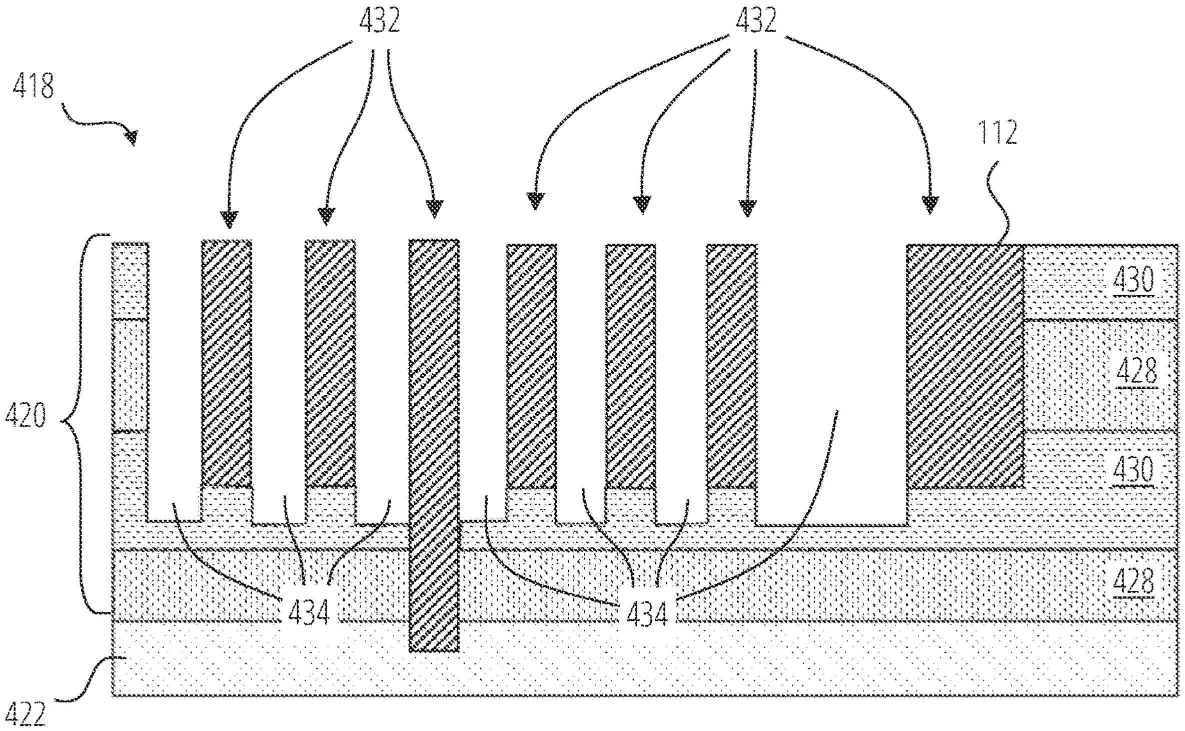

At operation 408, the method 400 includes removing portions of the electrically insulating material 420 to form air gaps 434 between the first electrically conductive material 112 in the trenches 432. Sidewalls of the electrically insulating material 420 and the first electrically conductive material 112 define the air gaps 434. The air gaps 434 extend partially through the electrically insulating material 420, such as through the upper nitride material 430 and the oxide material 428 and into the lower nitride material 430. FIG. 4F illustrates the air gaps 434 between laterally adjacent first electrically conductive materials 112. In some embodiments removing portions of the electrically insulating material 420 to form the air gaps 434 between the trenches 432 includes etching the electrically insulating material 420 between the laterally adjacent first electrically conductive materials 112 in the trenches 432 (e.g., with a selective etch process to leave the first electrically conductive material 112 in the trenches 432). The air gaps 434 may extend into the lower nitride material 430 to a depth below a lower surface of the first electrically conductive material 112. The depth of the air gaps 434 may depend on the process conditions, such as the etch chemistry, etch time, etc., used to remove the portions of the electrically insulating material 420.

Figure 4G:
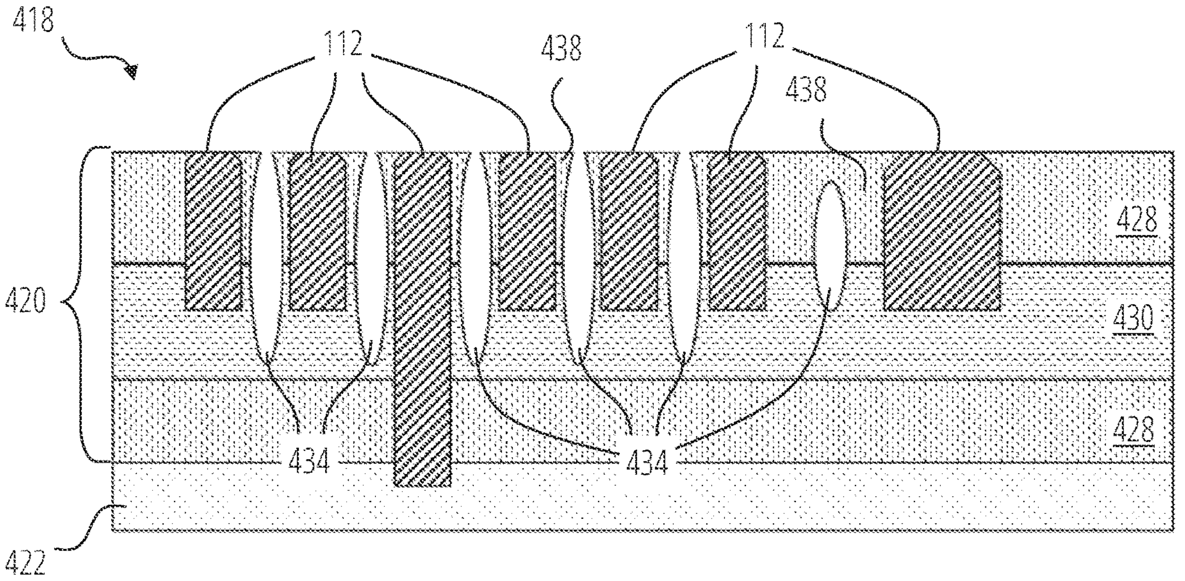

At operation 410, the method 400 includes polishing the electrically insulating material 420 and the first electrically conductive material 112. FIG. 4G illustrates the polished electrically insulating material 420 and first electrically conductive material 112. Substantially all of the upper nitride material 430 may be removed by the polishing, such that an upper surface of the oxide material 428 is substantially co-planar with an upper surface of the first electrically conductive material 112. In some embodiments, polishing the electrically insulating material 420 and the first electrically conductive material 112 includes polishing the electrically insulating material 420 and the first electrically conductive material 112 using a CMP process.

In some embodiments, prior to polishing the electrically insulating material 420 and the first electrically conductive material 112, a subconformal oxide material 438 may be formed between pillars of the first electrically conductive material 112, as shown in FIG. 4G. In such embodiments, the added subconformal oxide material 438 may be an added portion of the electrically insulating material 420. Accordingly, the subconformal oxide material 438 may define the air gaps 434. In some embodiments, the subconformal oxide material 438 may include a low-k dielectric material to reduce the impact the subconformal oxide material 438 has on mutual capacitance between the pillars of the first electrically conductive material 112.

In some embodiments the first electrically conductive material 112 may provide desirable mechanical strength properties to provide sufficient strength to support the structures of the first electrically conductive material 112 (e.g., bit line structures) through manufacturing process operations such as operation 408 and operation 410, which are illustrated in FIG. 4F and FIG. 4G, respectively. By way of non-limiting example, tungsten may be selected for the first electrically conductive material 112. By contrast, if an electrically conductive material having lower mechanical strength properties (e.g., copper) were used, one or more of operation 408 or operation 410 may compromise the ability of the first electrically conductive material 112 to provide the desired mechanical strength.

Figure 4H:
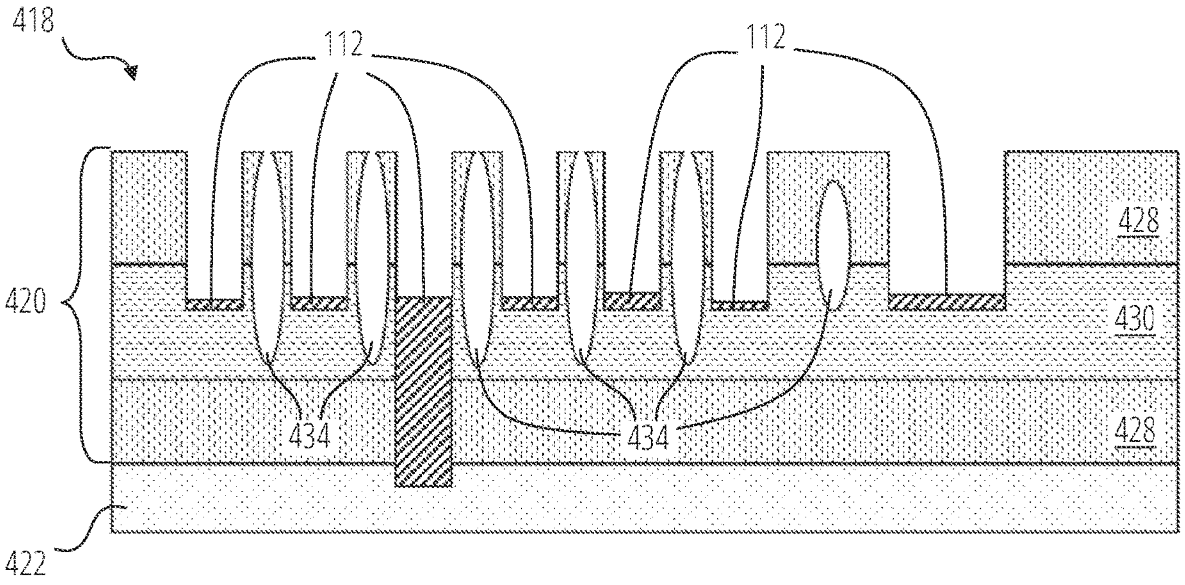

At operation 412, the method 400 includes recessing the first electrically conductive material 112 in the trenches 432. FIG. 4H illustrates the recessed first electrically conductive material 112. In some embodiments, recessing the first electrically conductive material 112 includes partially recessing the first electrically conductive material 112 to leave a portion of the first electrically conductive material 112 in the trenches 432, as illustrated in FIG. 4H. For example, the first electrically conductive material 112 may remain in a lower portion of the trenches 432. In some embodiments, however, recessing the first electrically conductive material 112 includes completely recessing (not shown) the first electrically conductive material 112. In some embodiments, recessing the first electrically conductive material 112 includes etching the first electrically conductive material 112 using one of a wet process or a dry process. The amount of first electrically conductive material 112 removed may depend on the process conditions, such as the etch chemistry, etch time, etc., used to recess the first electrically conductive material 112. There is, in principle, no minimum amount of the first electrically conductive material 112 that may remain (e.g., in some instances substantially none of the first electrically conductive material 112 may remain). The greater the portion of the first electrically conductive material 112 that is removed and replaced with the more conductive second electrically conductive material 114, the greater the benefit.

As a specific, non-limiting example, a phosphoric-acetic-nitric acid (PAN) chemistry may be used if the first electrically conductive material 112 is tungsten to selectively remove the tungsten without substantially removing the electrically insulating material 420 (e.g., the PAN chemistry may be tuned for oxide selectivity). Using the PAN chemistry process may result in a relatively rough upper surface of the remaining portions of the first electrically conductive material 112, which may contribute to the rough interface 302 illustrated in FIG. 3. Also, using the PAN chemistry process may result in misaligned top surfaces of the first electrically conductive material 112 due to variable depths of recess from one structure of the first electrically conductive material 112 to another (e.g., from bit line to bit line), which may contribute to the misaligned interfaces 202 and 204 illustrated in FIG. 2. In other words, the top surface of one or more of the remaining first electrically conductive materials 112 in the trenches 432 may be at a different depth (e.g., offset) than the top surface of others of the first electrically conductive materials 112 in the trenches 432.

Figure 4I:
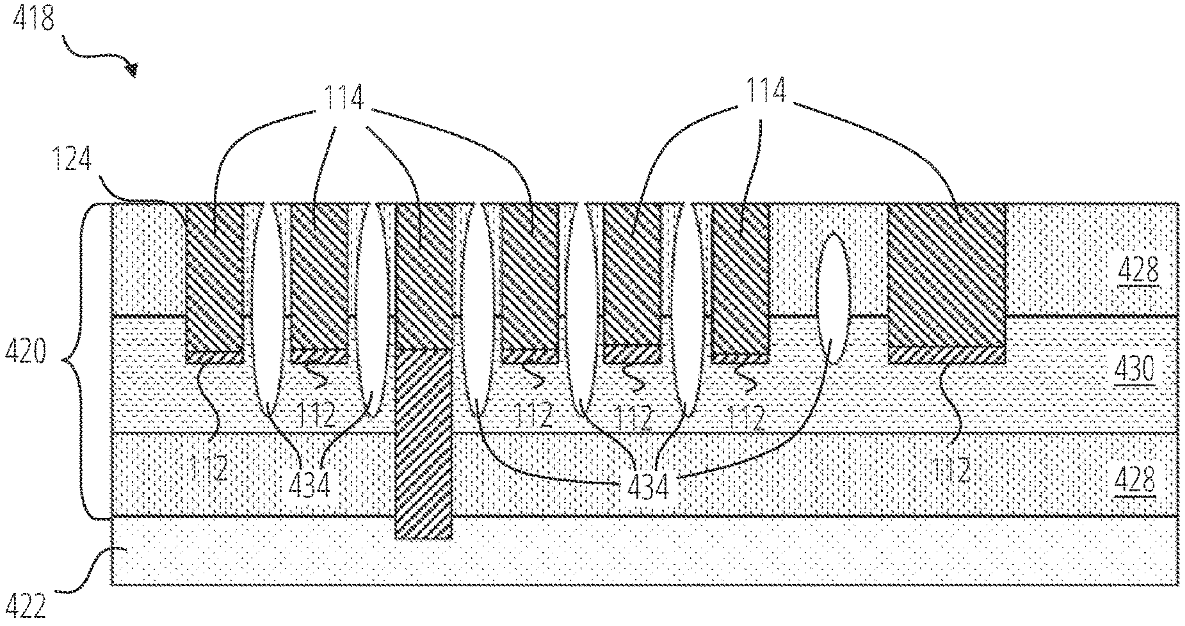

At operation 414, the method 400 includes replacing the first electrically conductive material 112 that was removed from within the trenches 432 with a second electrically conductive material 114. FIG. 4I illustrates the replacement of the first electrically conductive material 112 with the second electrically conductive material 114. The second electrically conductive material 114 is more electrically conductive than the first electrically conductive material 112. In embodiments where recessing the first electrically conductive material 112 includes partially recessing the first electrically conductive material 112, replacing the first electrically conductive material 112 with the second electrically conductive material 114 may include substantially filling a remainder of the trenches 432 with the second electrically conductive material 114. Therefore, the trenches 432 are substantially filled with the first electrically conductive material 112 and the second electrically conductive material 114. The first electrically conductive material 112 and the second electrically conductive material 114, in combination, form the bit lines 102*a*-102*g* of FIG. 1A, FIG. 1B, and FIG. 4J, with the second electrically conductive material 114 being more electrically conductive than the first electrically conductive material 112. Since the second electrically conductive material 114 is more electrically conductive than the first electrically conductive material 112, resulting bit lines including the second electrically conductive material 114 and a remaining portion of the first electrically conductive material 112 are more conductive than bit lines formed using only the first electrically conductive material. As a result, parasitic resistance of bit lines including the second electrically conductive material 114 and the remnants of the first electrically conductive material 112 is less than a parasitic resistance of bit lines including only the first electrically conductive material 112.

As described above for FIG. 3, the interface 302 between the first electrically conductive material 112 and the second electrically conductive material 114 may be rough (e.g., not planar, not smooth), with the grains 304 of the first electrically conductive material 112 protruding into the second electrically conductive material 114. Since the bit lines 102*a*-102*g* are separated from the air gaps 434 by portions of the electrically insulating material 420 (e.g., the subconformal oxide material 438 of FIG. 4G), shorting between the bit lines, such as between copper portions of the bit lines, may be prevented. The presence of the air gaps 434 reduces the mutual capacitance between structures of the first and second electrically conductive materials 112 and 114, which will ultimately become the bit lines 102*a*-102*g* of FIG. 1A, FIG. 1B, and FIG. 4J.

In some embodiments replacing the first electrically conductive material 112 that was removed with the second electrically conductive material 114 includes forming a liner material 124 to line the trenches 432, and subsequently filling the lined trenches 432 with the second electrically conductive material 114. In some embodiments, forming the liner material 124 includes forming a tantalum liner material. In some embodiments replacing the first electrically conductive material 112 that was removed with the second electrically conductive material 114 includes replacing the first electrically conductive material 112 that was removed with copper. In some embodiments replacing the first electrically conductive material 112 that was removed with copper includes reflowing copper. In some embodiments replacing the first electrically conductive material 112 that was removed with the second electrically conductive material 114 (e.g., copper) may include forming the second electrically conductive material 114 and recessing the second electrically conductive material 114 to smooth (e.g., planarize) the second electrically conductive material 114. In some embodiments, recessing the second electrically conductive material 114 includes performing CMP on the second electrically conductive material 114.

Figure 4J:
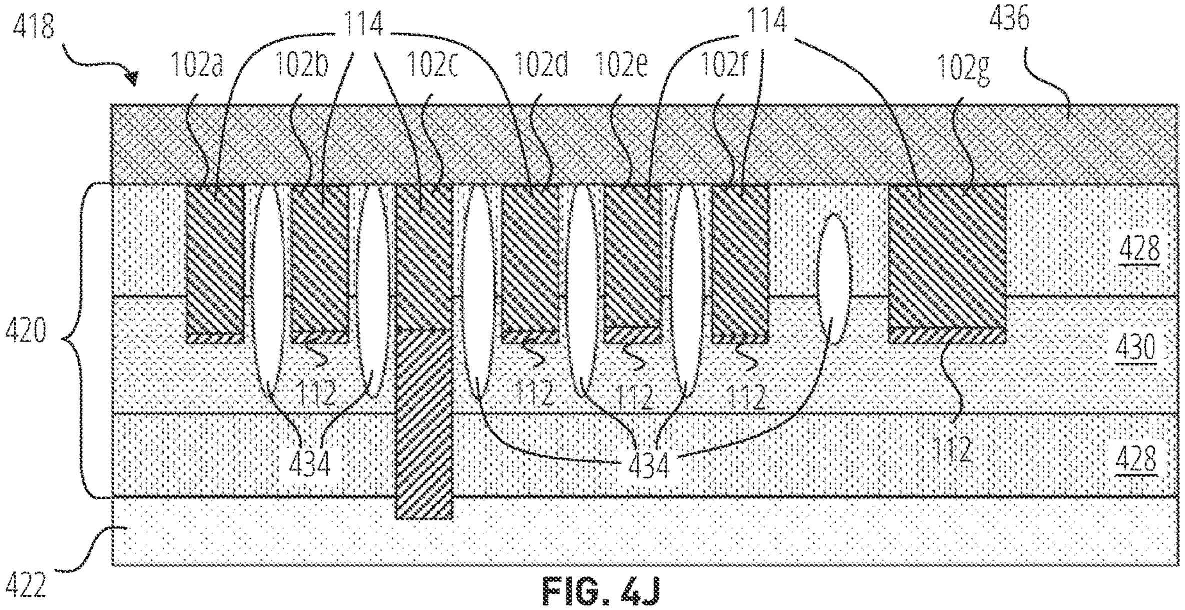

At operation 416, the method 400 includes forming a cap material 436 on the second electrically conductive material 114 and the electrically insulating material 420. FIG. 4J illustrates the cap material 436 formed on the second electrically conductive material 114 and the electrically insulating material 420.

As may be seen by inspecting FIG. 4J and FIG. 1A, the workpiece 418 of FIG. 4J is similar to the apparatus 100 of FIG. 1A and FIG. 1B. Accordingly, the method 400 corresponds to various embodiments that may be used to manufacture the apparatus 100 of FIG. 1A and FIG. 1B.

Figure 5:
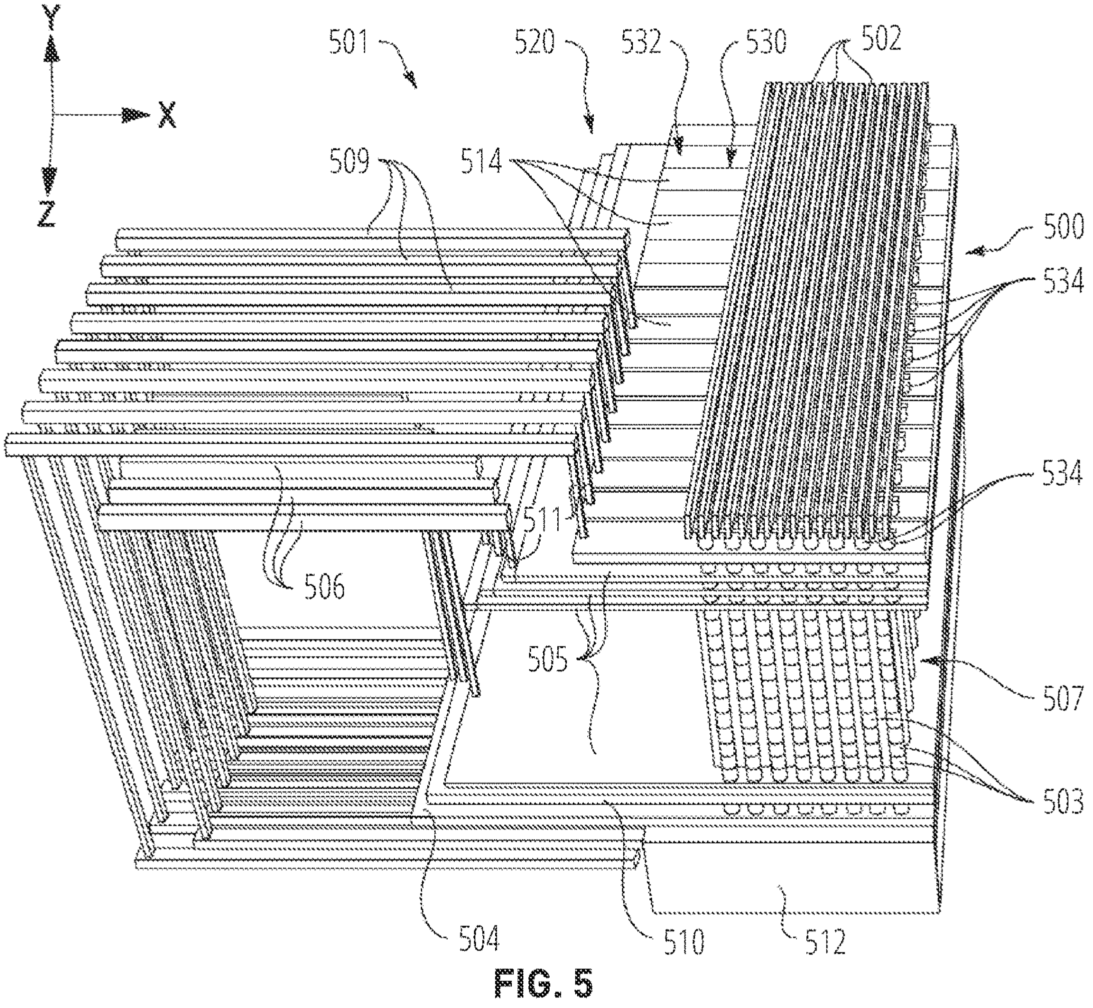
FIG. 5 is a partial cutaway perspective view of a microelectronic device, according to some embodiments.

FIG. 5 illustrates a partial cutaway perspective view of a portion of a microelectronic device 501 (e.g., a memory device, such as a dual deck 3D NAND Flash memory device) including a microelectronic device structure 500. The microelectronic device structure 500 may include structures substantially similar to the apparatus 100 following the processing stage previously disclosed with reference to FIGS. 4A-4L. As shown in FIG. 5, the microelectronic device structure 500 includes bit lines 502, which may be similar to the bit lines 102*a*-102*g* discussed above with reference to FIGS. 1A, 1B, and 4L. By way of non-limiting example, the microelectronic device structure 500 may include air gaps (e.g., the air gaps 104*a*-104*f* of FIGS. 1A and 1B, the air gaps 434 of FIG. 4L, without limitation) between the bit lines 502.

The microelectronic device structure 500 may also include a stair step structure 520 defining contact regions for connecting access lines 506 to conductive tiers 505 (e.g., conductive layers, conductive plates). The microelectronic device structure 500 may include vertical strings 507 (e.g., vertical strings 126 of FIGS. 1A and 1B) of memory cells 503, which may be electrically connected to each other in series. The vertical strings 507 may extend vertically (e.g., in the Z-direction) and orthogonally to conductive lines and tiers 505, such as bit lines 502, a source tier 504, the conductive tiers 505, the access lines 506, first select gates 514, select lines 509, and a second select gate 510 (e.g., a lower select gate, a source select gate (SGS)). The first select gates 514 may be horizontally divided (e.g., in the Y-direction) into multiple blocks 532 horizontally separated (e.g., in the Y-direction) from one another by slot structures 530.

Vertical conductive contacts 511 (e.g., the contacts 128 of FIG. 1A) may electrically connect components to each other as shown. For example, the select lines 509 may be electrically connected to the first select gates 514 and the access lines 506 may be electrically connected to the conductive tiers 505. The microelectronic device 501 may also include a control unit 512 positioned under the memory array, which may include control logic devices (e.g., the periphery circuitry 122 of FIG. 1A) configured to control various operations of other features (e.g., the vertical strings 507 of memory cells 503) of the microelectronic device 501. By way of non-limiting example, the control unit 512 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 512 may be electrically connected to the bit lines 502, the source tier 504, the access lines 506, the first select gates 514, and the second select gates 510, for example. In some embodiments, the control unit 512 includes CMOS (complementary metal-oxide-semiconductor) circuitry. In such embodiments, the control unit 512 may be characterized as having a "CMOS under Array" ("CuA") configuration.

The first select gates 514 may extend horizontally in a first direction (e.g., the X-direction) and may be electrically connected to respective first groups of vertical strings 507 of memory cells 503 at a first end (e.g., an upper end) of the vertical strings 507. The second select gate 510 may be formed in a substantially planar configuration and may be electrically connected to the vertical strings 507 at a second, opposite end (e.g., a lower end) of the vertical strings 507 of memory cells 503.

The bit lines 502 may extend horizontally in a second direction (e.g., in the Y-direction) that is at an angle (e.g., perpendicular) to the first direction in which the first select gates 514 extend. The bit lines 502 may be electrically connected to respective second groups of the vertical strings 507 at the first end (e.g., the upper end) of the vertical strings 507. A first group of vertical strings 507 electrically connected to a respective first select gate 514 may share a particular vertical string 507 with a second group of vertical strings 507 electrically connected to a respective bit line 502. Thus, a particular vertical string 507 may be selected at an intersection of a particular first select gate 514 and a particular bit line 502. Accordingly, the first select gates 514 may be used for selecting memory cells 503 of the vertical strings 507 of memory cells 503.

The conductive tiers 505 (e.g., word line plates) may extend in respective horizontal planes. The conductive tiers 505 may be stacked vertically, such that each conductive tier 505 is electrically connected to all of the vertical strings 507 of memory cells 503, and the vertical strings 507 of the memory cells 503 extend vertically through the stack of conductive tiers 505. The conductive tiers 505 may be electrically connected to or may form control gates of the memory cells 503 to which the conductive tiers 505 are electrically connected. Each conductive tier 505 may be electrically connected to one memory cell 503 of a particular vertical string 507 of memory cells 503.

The first select gates 514 and the second select gates 510 may operate to select a particular vertical string 507 of the memory cells 503 between a particular bit line 502 and the source tier 504. Thus, a particular memory cell 503 may be selected and electrically connected to a bit line 502 by operation of (e.g., by selecting) the appropriate first select gate 514, second select gate 510, and conductive tier 505 that are electrically connected to the particular memory cell 503.

The stair step structure 520 may be configured to provide electrical connection between the access lines 506 and the conductive tiers 505 through the vertical conductive contacts 511. In other words, a particular level of the conductive tiers 505 may be selected via an access line 506 in electrical communication with a respective vertical conductive contact 511 in electrical communication with the particular conductive tier 505.

The bit lines 502 may be electrically connected to the vertical strings 507 through conductive contact structures 534 (e.g., the contacts 128 of FIG. 1A).

Figure 6:
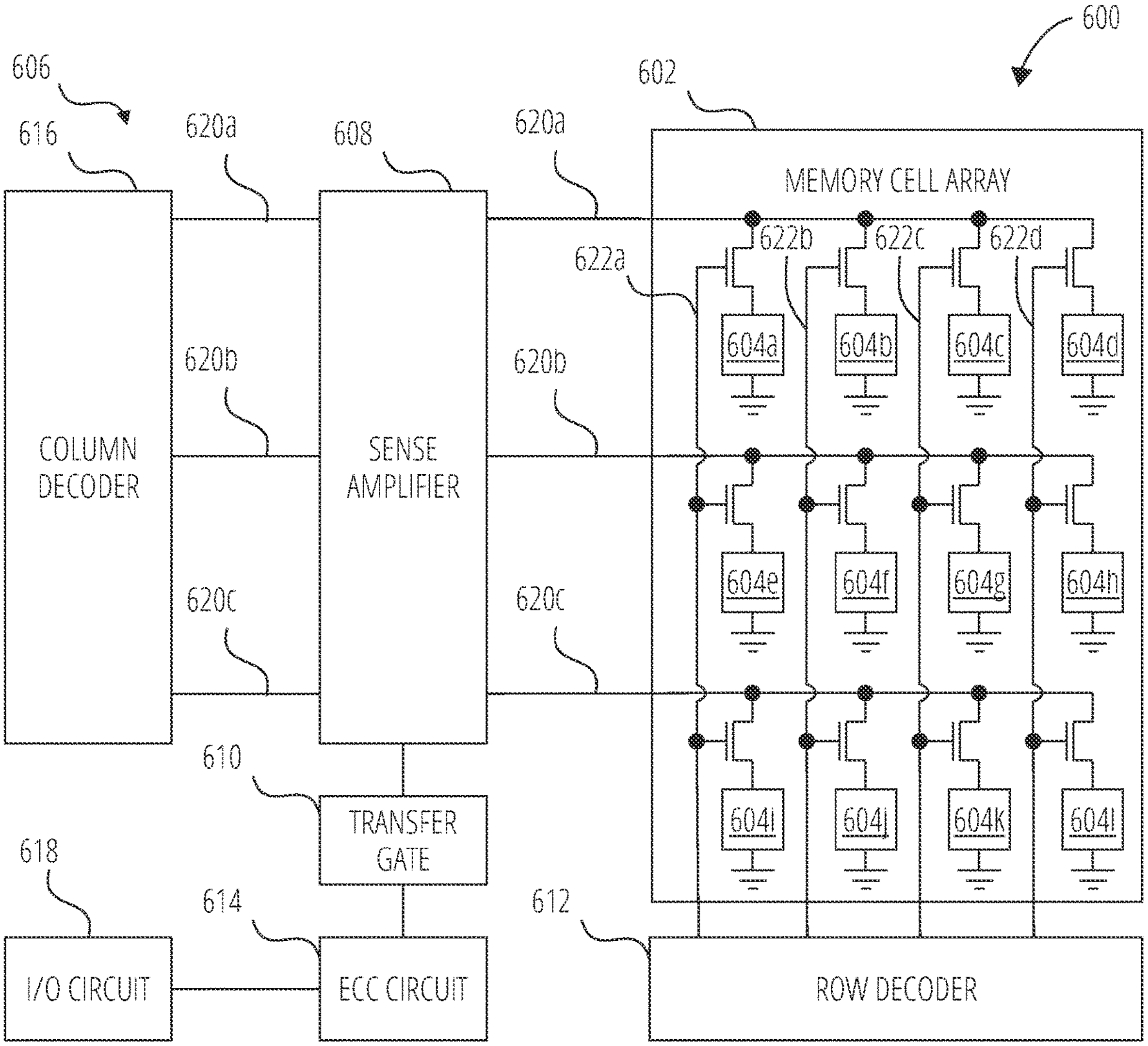
FIG. 6 is a block diagram of a portion of a memory device, according to some embodiments.

FIG. 6 is a block diagram of a portion of a memory device 600, according to some embodiments. The memory device 600 includes bit lines 620*a*-620*c*, which may be similar to the bit lines 102*a*-102*g* of FIG. 1A and FIG. 1B. The bit lines 620*a*-620*c* may be manufactured according to the method 400 of FIG. 4A. The bit lines 620*a*-620*c* may also be manufactured as illustrated in FIG. 4B through FIG. 4J. Accordingly, in some embodiments the bit lines 620*a*-620*c* may include a first portion including copper and a second portion including tungsten. In some embodiments, grains of the tungsten may protrude into the copper at interfaces between the tungsten and the copper. In some embodiments, interfaces between the tungsten and the copper are misaligned from bit line to bit line.

In some embodiments the bit lines 620*a*-620*c* may include copper to provide for a relatively high electrical conductivity of the bit lines 620*a*-620*c* and thereby provide for a relatively low parasitic resistance of the bit lines 620*a*-620*c*. In some embodiments air gaps (not shown) similar to the air gaps 104*a*-104*f* of FIG. 1A and FIG. 1B and the air gaps 434 of FIG. 4J may be positioned between the bit lines 620*a*-620*c* to provide for a relatively low absolute permittivity of material between the bit lines 620*a*-620*c* and thereby provide for relatively low mutual capacitance between the bit lines 620*a*-620*c*.

The memory device 600 includes word lines 622*a*-622*d*. The memory device 600 also includes a memory cell array 602, which is similar to the array 120 of memory cells of FIG. 1A and FIG. 1B and the array 424 of memory cells of FIG. 4A. The memory cell array 602 includes memory cells 604*a*-604*l* corresponding to intersections between the bit lines 620*a*-620*c* and the word lines 622*a*-622*d*. By way of non-limiting example, each of the memory cells 604*a*-604*l* may be electrically connected to one of the bit lines 620*a*-620*c* through a corresponding access transistor, and one of word lines 622*a*-622*d* may be electrically connected to a gate terminal of the corresponding access transistor to control memory cell access of the corresponding one of the bit lines 620*a*-620*c*.

By way of specific, non-limiting examples, memory cell 604*a* may correspond to an intersection between bit line 620*a* and word line 622*a*, memory cell 604*b* may correspond to an intersection between bit line 620*a* and word line 622*b*, memory cell 604*c* may correspond to an intersection between bit line 620*a* and word line 622*c*, memory cell 604*d* may correspond to an intersection between bit line 620*a* and word line 622*d*, memory cell 604*e* may correspond to an intersection between bit line 620*b* and word line 622*a*, memory cell 604*f* may correspond to an intersection between bit line 620*b* and word line 622*b*, memory cell 604*g* may correspond to an intersection between bit line 620*b* and word line 622*c*, memory cell 604*h* may correspond to an intersection between bit line 620*b* and word line 622*d*, memory cell 604*i* may correspond to an intersection between bit line 620*c* and word line 622*a*, memory cell 604*j* may correspond to an intersection between bit line 620*c* and word line 622*b*, memory cell 604*k* may correspond to an intersection between bit line 620*c* and word line 622*c*, and memory cell 604*l* may correspond to an intersection between bit line 620*c* and word line 622*d*.

The memory device 600 also includes periphery circuitry 606 electrically connected to the memory cell array 602 via at least the bit lines 620*a*-620*c*. The periphery circuitry 606 illustrated in FIG. 6 includes a column decoder 616, a sense amplifier 608, a transfer gate 610, an error correction control circuit (ECC circuit 614), an input/output circuit 618, and a row decoder 612. The periphery circuitry 606 may also include other devices not shown in FIG. 6 such as an address input circuit, a latch circuit, a command input circuit, a command decoder, a clock input circuit, an internal clock generator, a timing generator, an internal voltage generator, a calibration circuit, other devices, or combinations thereof.

In some embodiments, selection of one of the word lines 622*a*-622*d* may be performed by the row decoder 612, while selection of one of the bit lines 620*a*-620*c* may be performed by the column decoder 616. By way of non-limiting example, a row address signal and a bank address signal may be supplied to the row decoder 612, while a column address signal and the bank address signal may be supplied to the column decoder 616. Internal commands may also be supplied to the column decoder 616 and the row decoder 612.

The bit lines 620*a*-620*c* are electrically connected to the sense amplifier 608. When data is read from the memory cell array 602, data sensed from the one of the bit lines 620*a*-620*c* is amplified by the sense amplifier 608, and thereafter transferred to the ECC circuit 614 via local data lines, the transfer gate 610 (e.g., a switch circuit), and main data lines. When data is written to the memory cell array 602, data outputted from the ECC circuit 614 may be transferred to the sense amplifier 608 via the main data lines, the transfer gate 610, and the local data lines, and written to one of the memory cells 604*a* that is connected to a selected one of the bit lines 620*a*-620*c*. A parity bit (e.g., from the ECC circuit 614) may also be written.

Figure 7:
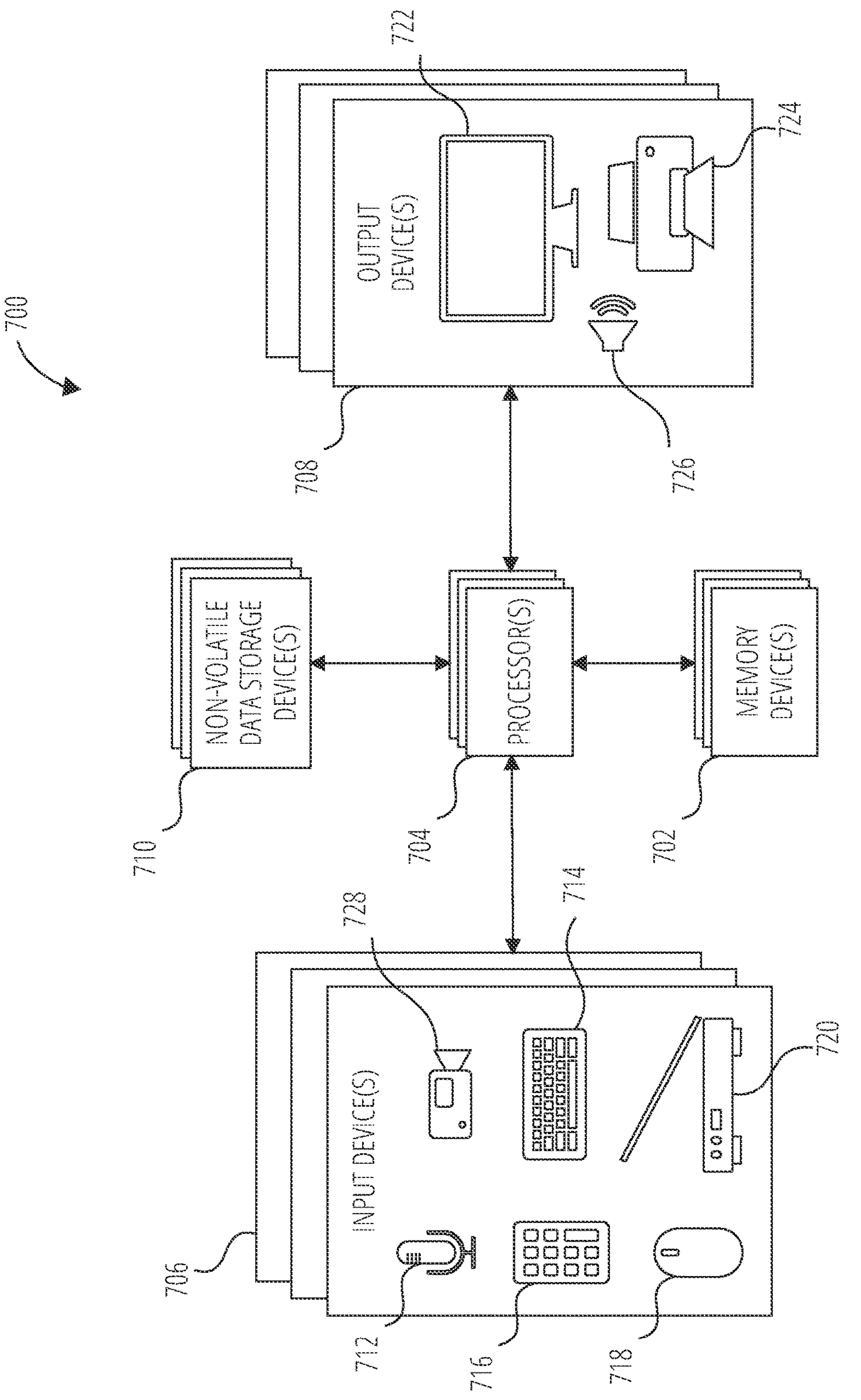
FIG. 7 is a block diagram of a computing system, according to some embodiments.

FIG. 7 is a block diagram of a computing system 700, according to some embodiments. The computing system 700 includes one or more processors 704 operably coupled to one or more memory devices 702, one or more non-volatile data storage devices 710, one or more input devices 706, and one or more output devices 708. In some embodiments, the computing system 700 includes a personal computer (PC) such as a desktop computer, a laptop computer, a tablet computer, a mobile computer (e.g., a smartphone, a personal digital assistant (PDA), etc.), a network server, or other computer device.

In some embodiments, the one or more processors 704 may include a central processing unit (CPU) or other processor configured to control the computing system 700. In some embodiments the one or more memory devices 702 include random access memory (RAM), such as volatile data storage (e.g., dynamic RAM (DRAM) static RAM (SRAM), etc.). In some embodiments the one or more non-volatile data storage devices 710 include a hard drive, a solid state drive, Flash memory, erasable programmable read only memory (EPROM), other non-volatile data storage devices, or any combination thereof. In some embodiments the one or more input devices 706 include a keyboard 714, a pointing device 718 (e.g., a mouse, a track pad, etc.), a microphone 712, a keypad 716, a scanner 720, a camera 728, other input devices, or any combination thereof. In some embodiments the output devices 708 include an electronic display 722, a speaker 726, a printer 724, other output devices, or any combination thereof.

The one or more memory devices 702 include the microelectronic device structure 500 of FIG. 5 and/or the memory device 600 of FIG. 6. For example, the one or more memory devices 702 include a memory cell array including memory cells and bit lines electrically connected to the memory cells. The bit lines include a first electrically conductive material and a second electrically conductive material. The second electrically conductive material is more electrically conductive than the first electrically conductive material. By way of non-limiting example, the second electrically conductive material may be copper. The one or more memory devices 702 also include air gaps between the bit lines.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following accompanying claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:

an electrically insulating material;

bit lines in the electrically insulating material, the electrically insulating material defining air gaps between the bit lines, at least some of the bit lines including elemental tungsten in a first portion and copper in a second portion overlying the first portion;

strings of memory cells extending at least substantially perpendicularly to the bit lines; and contacts electrically connecting the strings of memory cells to the bit lines.

2. The apparatus of claim 1, wherein an interface between the copper and the elemental tungsten is non-planar.

3. The apparatus of claim 1, wherein:

a first interface between the copper and the elemental tungsten in a first bit line of the bit lines is at a first distance from a bottom surface of the electrically insulating material, and a second interface between the copper and the elemental tungsten in a second bit line of the bit lines is at a second distance from the bottom surface of the electrically insulating material, the second distance different than the first distance.

4. The apparatus of claim 1, further comprising a liner material between the electrically insulating material and the bit lines.

5. The apparatus of claim 4, wherein the liner material includes tantalum.

6. A method of manufacturing a memory device, the method comprising:

forming contacts over vertical strings of memory cells;

forming an electrically insulating material over the contacts; and forming bit lines in the electrically insulating material and at least substantially perpendicularly to the vertical strings of memory cells, at least some of the bit lines electrically connecting to the vertical strings of memory cells through the contacts, the electrically insulating material defining air gaps between the bit lines, wherein forming the bit line in the electrically insulating material comprises:

forming trenches in the electrically insulating material over the contacts and the vertical strings of memory cells;

forming a first electrically conductive material comprising elemental tungsten in the trenches;

removing portions of the electrically insulating material to form air gaps between the trenches;

removing at least a portion of the first electrically conductive material from the trenches; and forming a second electrically conductive material comprising copper in the trenches to replace the removed first electrically conductive material, the second electrically conductive material overlying the first electrically conductive material and the second electrically conductive material more electrically conductive than the first electrically conductive material.

7. The method of claim 6, wherein:

removing at least a portion of the first electrically conductive material from the trenches includes partially recessing the first electrically conductive material to leave a portion of the first electrically conductive material in the trenches; and forming a second electrically conductive material in the trenches to replace the removed first electrically conductive material includes filling a remainder of the trenches with the second electrically conductive material.

8. The method of claim 6, wherein forming the second electrically conductive material in the trenches to replace the removed first electrically conductive material includes:

forming a liner material in the trenches; and filling the trenches with the second electrically conductive material.

9. The method of claim 8, wherein forming the liner material includes forming a tantalum liner material.

10. A method of manufacturing a memory device, the method comprising:

forming a first electrically conductive material comprising elemental tungsten in trenches in an electrically insulating material over vertical strings of memory cells;

removing excess portions of the first electrically conductive material to expose the electrically insulating material between the trenches;

removing portions of the electrically insulating material to form air gaps laterally adjacent to the first electrically conductive material within the trenches;

removing a portion of the electrically insulating material and the first electrically conductive material;

recessing the first electrically conductive material within the trenches; and forming a second electrically conductive material comprising copper over the first electrically conductive material and within the trenches to form bit lines comprising a lower portion including the elemental tungsten and an upper portion including the copper, the electrically insulating material including the bit lines therein, the air gaps positioned between the bit lines, a memory cell array including memory cells corresponding to intersections between the bit lines and the word lines, the second electrically conductive material more electrically conductive than the first electrically conductive material.

11. The method of claim 10, wherein recessing the first electrically conductive material within the trenches comprises etching the first electrically conductive material using a phosphoric-acetic-nitric acid (PAN) etch chemistry.

12. An apparatus, comprising:

bit lines comprising a lower portion including tungsten and an upper portion including copper;

an electrically insulating material including the bit lines therein, an interface between the lower portion and the upper portion in one of the bit lines being at a different depth within the electrically insulating material than an additional interface between an additional lower portion and an additional upper portion in an additional one of the bit lines;

air gaps between the bit lines;

word lines; and a memory cell array including memory cells corresponding to intersections between the bit lines and the word lines.

13. The apparatus of claim 12, further comprising periphery circuitry electrically connected to the memory cell array via at least the bit lines.

14. The apparatus of claim 13, wherein the periphery circuitry includes one or more of a column decoder, a sense amplifier, a transfer gate, an error correction control circuit, an input/output circuit, and a row decoder.

15. The apparatus of claim 12, wherein grains of the tungsten protrude into the copper at interfaces between the tungsten and the copper.

16. A computing system, comprising:

a memory cell array including memory cells; and bit lines over the memory cell array, the bit lines electrically connected to the memory cells, the bit lines including a first electrically conductive material comprising elemental tungsten and a second electrically conductive material comprising copper, the second electrically conductive material more electrically conductive than the first electrically conductive material.

17. The computing system of claim 16, further comprising air gaps between the bit lines.

18. The computing system of claim 16, further comprising a memory device including the memory cell array and the bit lines.

19. The computing system of claim 18, further comprising:

one or more processors electrically connected to the memory device;

one or more non-volatile data storage devices electrically connected to the one or more processors; and one or more output devices electrically connected to the one or more processors.

* * * * *